United States Patent
DeBrabander et al.

(10) Patent No.: US 7,011,979 B2
(45) Date of Patent: Mar. 14, 2006

(54) DETECTING PINHOLES IN VERTICAL CAVITY SURFACE-EMITTING LASER PASSIVATION

(76) Inventors: Gregory N. DeBrabander, 3030 Vesuvius La., San Jose, CA (US) 95132; Robert W. Herrick, 3453 Lynn Oaks Dr., San Jose, CA (US) 95117; Suning Xie, 3655 Pruneridge Ave. #20, Santa Clara, CA (US) 95051; Matthew C. Slater, 601 Almarida Dr., Apt. #D-9, Campbell, CA (US) 95008

( * ) Notice: Subject to any disclaimer, the term of this patent is extended or adjusted under 35 U.S.C. 154(b) by 270 days.

(21) Appl. No.: 10/387,621

(22) Filed: Mar. 12, 2003

(65) Prior Publication Data
US 2004/0180454 A1 Sep. 16, 2004

(51) Int. Cl.
*H01L 21/66* (2006.01)
(52) U.S. Cl. .................. 438/14; 438/7; 438/8; 438/16
(58) Field of Classification Search .............. 438/13, 438/14, 15, 16, 17, 18, 7, 8
See application file for complete search history.

(56) References Cited

U.S. PATENT DOCUMENTS 5,962,344 A * 10/1999 Tu et al. ................ 438/694
6,248,601 B1 * 6/2001 Chou ...................... 438/14
2001/0016420 A1 * 8/2001 Chou ..................... 438/687
2004/0156410 A1 * 8/2004 DeBrabander et al. ...... 372/46

FOREIGN PATENT DOCUMENTS

EP 0345924 * 12/1989

OTHER PUBLICATIONS

S. Xie et al., "Reliability of Oxide VCSELs in non-Hermetic Environments", Proceedings of the 15th IEEE Laser and Electro-Optics Society Annual Meetings (LEOS 2002), Glasgow, Scotland, p. 544, paper WW2, Nov. 10-14, 2002, 2 pages.
S. Xie et al., "Reliability and Failure Mechanisms of Oxide VCSELs in non-Hermetic Environments", Prooceedings of SPIE vol. 4994, Vertical-Cavity Surface-Emitting Lasers VII, paper 4994-21, San Jose, CA, Jan. 25-31, 2003, 8 pages.
S. Xie et al., "Failure Mode Analysis of Oxide VCSELs in High Humidity and High Temperature", IEEE/OSA Journal of Lightwave Technology, Mar. 2003 (in press) pp. 1-11.

* cited by examiner

*Primary Examiner*—Kevin M. Picardat

(57) ABSTRACT

A method for detecting a passivation pinhole includes forming an oxide vertical cavity surface-emitting laser (VCSEL) having an oxidation cavity, forming a passivation layer over a surface of the oxidation cavity, exposing the oxide VCSEL to an etchant vapor, and inspecting the oxide VCSEL for a defect caused by the etchant vapor.

12 Claims, 3 Drawing Sheets

DETECTING PINHOLES IN VERTICAL CAVITY SURFACE-EMITTING LASER PASSIVATION

FIELD OF INVENTION

This invention relates to oxide vertical cavity surface-emitting lasers (VCSELs).

DESCRIPTION OF RELATED ART

Oxide VCSELs are fabricated by oxidizing a layer in the epitaxial stack through cavities etched in the wafer face to define a lasing area. This process leaves an entry path for moisture that causes oxide VCSEL failure in operation. For example, see S. Xie, G. De Brabander, W. Widjaja, U. Koelle, A. N. Cheng, L. Giovane, F. Hu, R. Herrick, M. Keever, and T. Osentowski, "Reliability of Oxide VCSELs in non-Hermetic Environments", Proceedings of the 15th IEEE Laser and Electro-Optics Society Annual Meeting (LEOS 2002), Glasgow, Scotland, p. 544, paper WW2, Nov. 10–14, 2002; S. Xie, R. Herrick, G. De Brabander, W. Widjaja, U. Koelle, A. N. Cheng, L. Giovane, F. Hu, R. Herrick, M. Keever, T. Osentowski, S. McHugo, M. Mayonte, S. Kim, D. Chamberlin, S. J. Rosner, and G. Girolami, "Reliability and Failure Mechanisms of Oxide VCSELs in non-Hermetic Environments", Proceedings of SPIE Vol. 4994, Vertical-Cavity Surface-Emitting Lasers VII, paper 4994–21, San Jose, Calif., Jan. 25–31, 2003; and S. Xie, R. Herrick, D. Chamberlin, S. J. Rosner, S. McHugo, G. Girolami, M. Mayonte, S. Kim, and W. Widjaja, "Failure Mode Analysis of Oxide VCSELs in High Humidity and High Temperature", IEEE/OSA Journal of Lighwave Technology, March 2003 (in press).

Thus, oxide VCSELs need to be either packaged in hermetic cans, which is an expensive and cumbersome option for multi-channel arrays, or passivated to prevent moisture from getting into the oxide layer. Passivation films can contain pinholes, which lead to early failure. These pinholes are difficult to screen out so a technique is needed to make them apparent.

SUMMARY

In one embodiment of the invention, a method for detecting a passivation pinhole includes forming an oxide vertical cavity surface-emitting laser (VCSEL) having an oxidation cavity, forming a passivation layer over a surface of the oxidation cavity, exposing the oxide VCSEL to an etchant vapor, and inspecting the oxide VCSEL for a defect caused by the etchant vapor.

DETAILED DESCRIPTION

Figure 1:
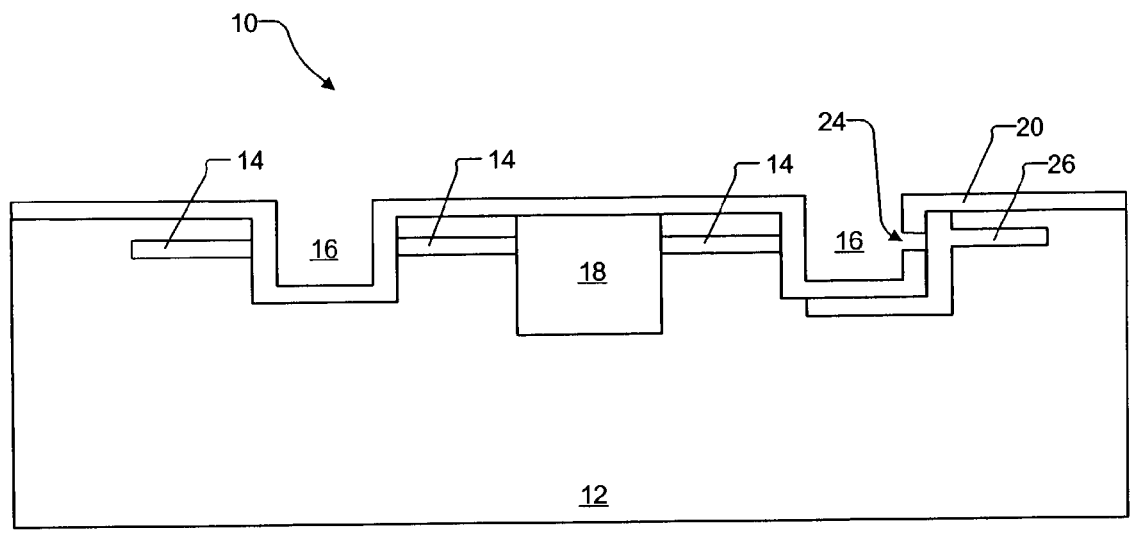
FIGS. 1 and 2 illustrate a cross-section and a top view of a VCSEL in one embodiment of the invention.

FIG. 1 illustrates an oxide VCSEL 10 in one embodiment of the invention. Typically, oxide VCSEL 10 includes a VCSEL structure 12 formed by growing a bottom mirror region atop a gallium arsenide wafer, an active region atop of the bottom mirror region, and a top mirror region atop of the active region. Since the construction of VCSELs is well known, the exact structure and process are not described in detail.

Typically, the bottom mirror region is an n-doped DBR (distributed Bragg reflector) mirror structure constructed from alternating layers having different refractive indices. The alternating layers can be made of aluminum gallium arsenide (AlGaAs) at two different aluminum mole fractions (e.g., 90% and 15%).

Typically, the active region is made of gallium arsenide (GaAs).

Typically, the top mirror region is a p-doped DBR mirror structure constructed from alternating layers having different refractive indices. Like the bottom mirror region, the alternating layers can be made of AlGaAs at two different aluminum mole fractions (e.g., 90% and 15%). After growing one or more pairs of the alternating layers in the top mirror region, an oxidation layer 14 is grown. Oxidation layer 14 is made of AlGaAs at the highest aluminum mole fraction (e.g., 95%) in VCSEL structure 12. Then, the rest of the alternating layers in the top mirror region are grown.

VCSEL structure 12 is then etched to form one or more oxidation cavities 16. Oxidation cavities 16 extend into the top mirror region and pass oxidation layer 14. Oxidation cavities 16 are formed around a lasing area of the resulting VCSEL. A nitride mask layer can be used to define where oxidation cavities 16 are etched. Oxidation cavities 16 can be formed by either wet or dry etch.

Figure 2:
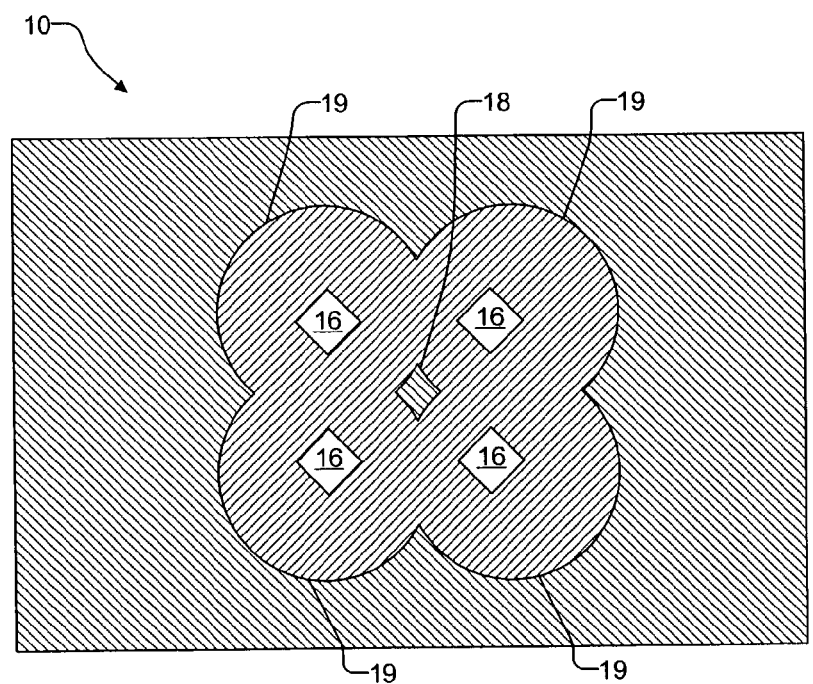

VCSEL structure 12 is next placed in an oxidation oven. The nitride mask layer used for etching oxidation cavities 16 can remain as an oxidation mask to prevent the oxidation of the top surface of VCSEL structure 12. Steam is introduced through oxidation cavities 16 to oxidation layer 14, which laterally oxidizes. The oxidized regions, also called oxidation fronts, form insulation regions that limit current flow and establish optical confinement within an aperture or lasing volume 18 of the resulting VCSEL 10. FIG. 2 illustrates a top view of VCSEL 10 with overlapping oxidation fronts 19 that define aperture 18.

Referring back to FIG. 1, VCSEL structure 12 is next coated with a passivation layer 20. Notably, passivation layer 20 covers the surface of oxidation cavities 16. This layer may be made of multiple film stacks. Passivation layer 20 may be made of silicon nitride (SiN) with a thickness of approximately 0.5 micron. Passivation layer 20 can be formed by plasma-enhanced chemical vapor deposition (PECVD).

One or more passivation pinholes 24 may form in passivation layer 20, exposing VCSEL structure 12 to moisture that can cause it to fail prematurely. In accordance with the invention, VCSEL 10 is exposed to an etchant in a chamber to make the presence of the pinholes visible.

Figure 3:
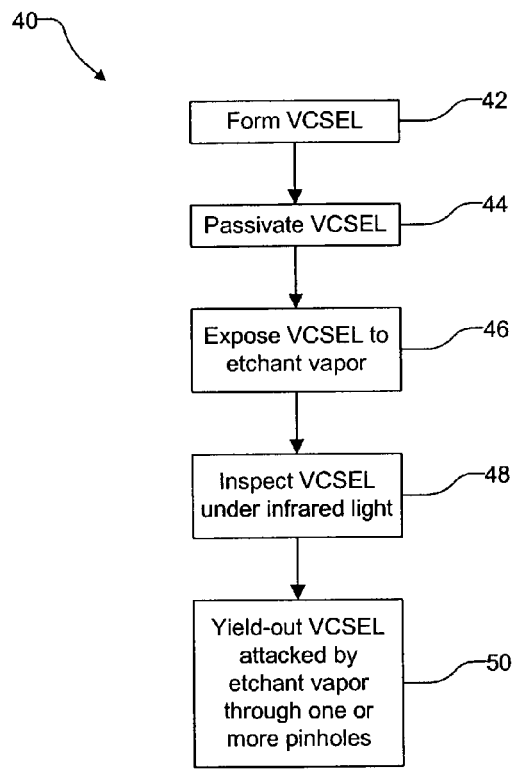
FIG. 3 is a flowchart of a method for detecting passivation pinholes in one embodiment of the invention.
Figure 4:
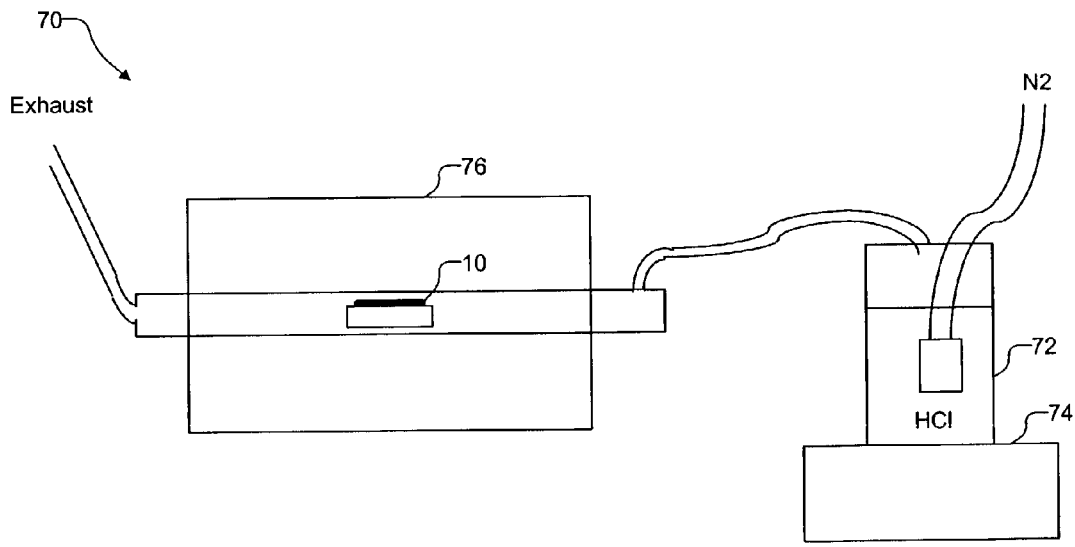
FIG. 4 illustrates a system for detecting passivation pinholes in one embodiment of the invention.

FIG. 3 is a flowchart of a method 40 to identify passivation pinholes in one embodiment of the invention. Method 40 exposes VCSEL 10 to an etchant vapor in a furnace to make the presence of the pinholes visible.

In step 42, VCSEL 10 (FIG. 1) is formed. In one embodiment, VCSEL 10 is formed as described above.

In step 44, VCSEL 10 is passivated. In one embodiment, passivation is formed as described above.

In step 46, VCSEL 10 is exposed to an etchant vapor such as hydrochloric acid (HCl) vapor. The etchant vapor does not attack the passivation layers but produces a visually detectable defect 26 (FIG. 1) in VCSEL structure 12 (FIG. 1). The etchant vapor is able to penetrate the passivation pinholes the same way as water vapor. Once the etchant vapor penetrates the passivation pinholes, the etchant vapor attacks VCSEL structure 12 to produce visually detectable defect 26.

In one embodiment illustrated in FIG. 3, HCl vapor is produced by heating liquid HCl in a bubbler 72 heated by a hotplate 74. An inert gas such as nitrogen (N2) is fed to bubbler 72 to force the HCl vapor to a horizontal tube furnace 76. Inside furnace 76, VCSEL 10 is exposed to HCl vapor at an elevated temperature. In this embodiment, bubbler 72 is heated to 30° C., N2 flow is maintained at 1 slpm (standard liter per minute), furnace 76 is heated to 285° C., and VCSEL 10 is exposed to HCl vapor for 2 hours.

Figure 5:
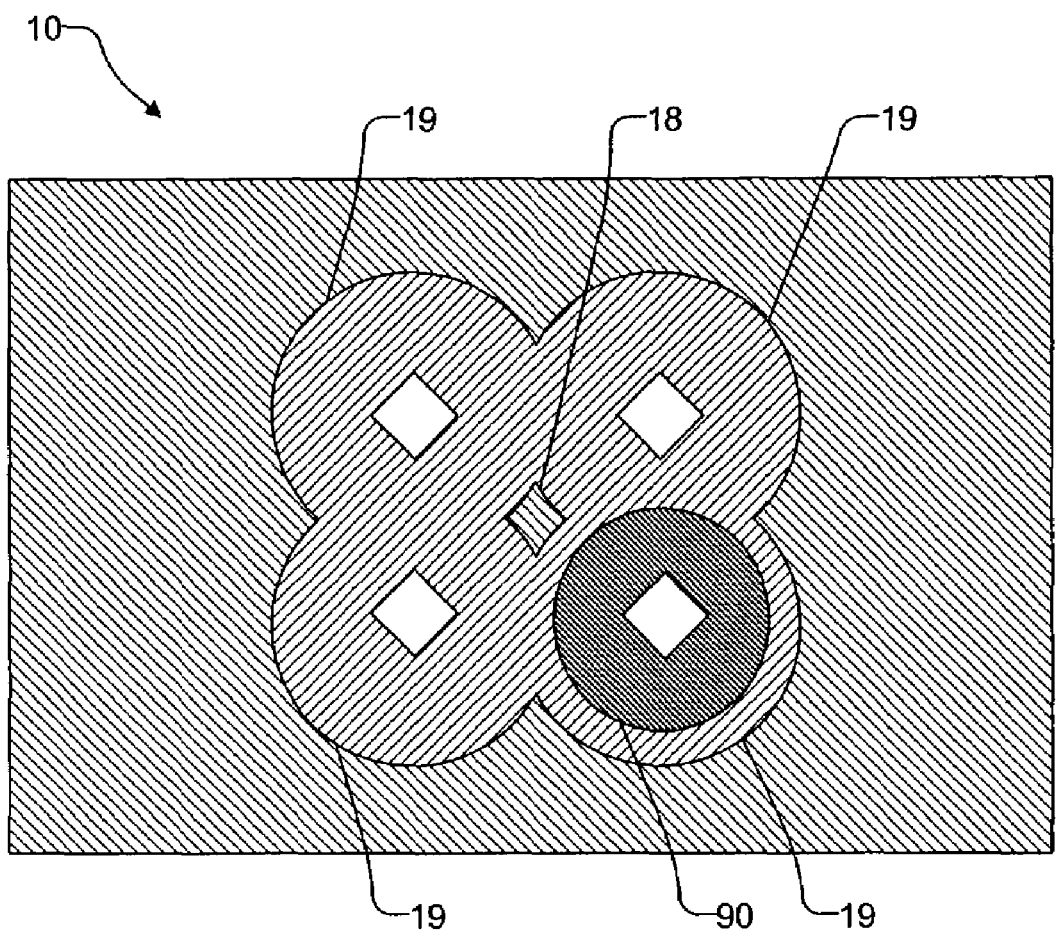
FIG. 5 illustrates a top view of a VCSEL with a defect caused by an etchant vapor through passivation pinholes in one embodiment of the invention.

In step 48, VCSEL 10 is inspected for visually detectable defect 26 under infrared light, which allows the oxidation layer to be examined through the optically opaque semiconductor layers. In one embodiment, VCSEL 10 is inspected under an infrared microscope with a bandpass filter selected to maximize the contrast of the attacked layer to an unattacked layer. FIG. 5 illustrates a top view of VCSEL 10 captured with the infrared microscope after exposure to HCl vapor.

In step 50, VCSEL 10 is yielded out if it has visually detectable defect 26. FIG. 5 illustrates that defect 26 appears as a second oxidation front 90 under infrared light.

Various other adaptations and combinations of features of the embodiments disclosed are within the scope of the invention. Although only one VCSEL is shown in the figures, one skilled in the art understands that the process described can be used to test an array of VCSELs on a die. Furthermore, although etchant vapor is used, etchant liquid could also be used to penetrate the passivation pinholes and produce visually detectable defect 26. Numerous embodiments are encompassed by the following claims.

What is claimed is:

1. A method for detecting a passivation pinhole, comprising:
    forming an oxide vertical cavity surface-emitting laser (VCSEL) having an oxidation cavity;
    forming a passivation layer over a surface of the oxidation cavity;
    exposing the oxide VCSEL to an hotplate and pressurized by a supply of an inert gas.

2. The method of claim 1, wherein said inspecting the oxide VCSEL comprises examining the oxide VCSEL under an infrared light.

3. The method of claim 2, wherein said inspecting the oxide VCSEL further comprises examining the oxide VCSEL with an infrared filter.

4. The method of claim 1, wherein the defect appears under infrared light as an oxidation front caused by the etchant.

5. The method of claim 1, wherein the etchant is in a vapor form.

6. The method of claim 5, wherein the oxide VCSEL is exposed to the etchant inside a furnace.

7. The method of claim 1, wherein the etchant comprises a hydrochloric acid (HCl) vapor.

8. The method of claim 7, further comprising heating a wet HCl to generate the (HCl) vapor.

9. The method of claim 8, wherein the wet HCl is heated to 30° C.

10. The method of claim 9, wherein the HCl vapor is pressurized by an inert gas supplied at one standard liter per minute.

11. The method of claim 10, wherein the oxide VCSEL is exposed to the HCl vapor inside a furnace at 285° C.

12. The method of claim 11, wherein the oxide VCSEL is exposed to the HCl vapor for two hours.

* * * * *